(12) United States Patent
Wu et al.

(10) Patent No.: US 11,392,041 B2
(45) Date of Patent: Jul. 19, 2022

(54) PARTICLE REMOVAL DEVICE AND METHOD

(71) Applicant: TAIWAN SEMICONDUCTOR MANUFACTURING COMPANY, LTD., Hsinchu (TW)

(72) Inventors: Cheng-Hsuan Wu, New Taipei (TW); Ming-Hsun Tsai, Hsinchu (TW); Shang-Chieh Chien, New Taipei (TW); Li-Jui Chen, Hsinchu (TW); Heng-Hsin Liu, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/239,952

(22) Filed: Apr. 26, 2021

(65) Prior Publication Data

US 2022/0100100 A1 Mar. 31, 2022

Related U.S. Application Data

(60) Provisional application No. 63/084,262, filed on Sep. 28, 2020.

(51) Int. Cl.
*G03F 7/20* (2006.01)
(52) U.S. Cl.
CPC ...... *G03F 7/70033* (2013.01); *G03F 7/70358* (2013.01); *G03F 7/70908* (2013.01); *G03F 7/70925* (2013.01)

(58) Field of Classification Search
CPC .............................. G03F 7/70925; B08B 6/00
See application file for complete search history.

(56) References Cited

U.S. PATENT DOCUMENTS

| | | | | |
|---|---|---|---|---|
| 4,751,759 A * | 6/1988 | Zoell | ........................ | A47L 5/14 15/1.51 |
| 5,187,635 A * | 2/1993 | Yehl | ...................... | B64D 13/00 361/231 |
| 10,873,291 B1 * | 12/2020 | Parker | ...................... | B08B 6/00 |
| 2004/0165160 A1 * | 8/2004 | Van Beek | .......... | G03F 7/70925 355/53 |
| 2010/0049177 A1 * | 2/2010 | Boone, III | .......... | A61H 9/0057 606/9 |
| 2010/0089015 A1 * | 4/2010 | Takayanagi | .............. | B08B 5/02 55/431 |
| 2011/0186436 A1 * | 8/2011 | Novosselov | ............. | G01J 1/58 204/600 |

FOREIGN PATENT DOCUMENTS

CN 206701859 U * 12/2017

* cited by examiner

*Primary Examiner* — Steven Whitesell Gordon
(74) *Attorney, Agent, or Firm* — NZ Carr Law Office

(57) ABSTRACT

A particle removal device, along with methods of using such, are described. The device includes a handheld module having a body. A first one or more channels and a second one or more channels are formed in the body. The body includes a nozzle, and the handheld module is configured to provide suction by the nozzle and to inject an ionized fluid stream by the nozzle. The body further includes a handle attached to the nozzle.

20 Claims, 11 Drawing Sheets

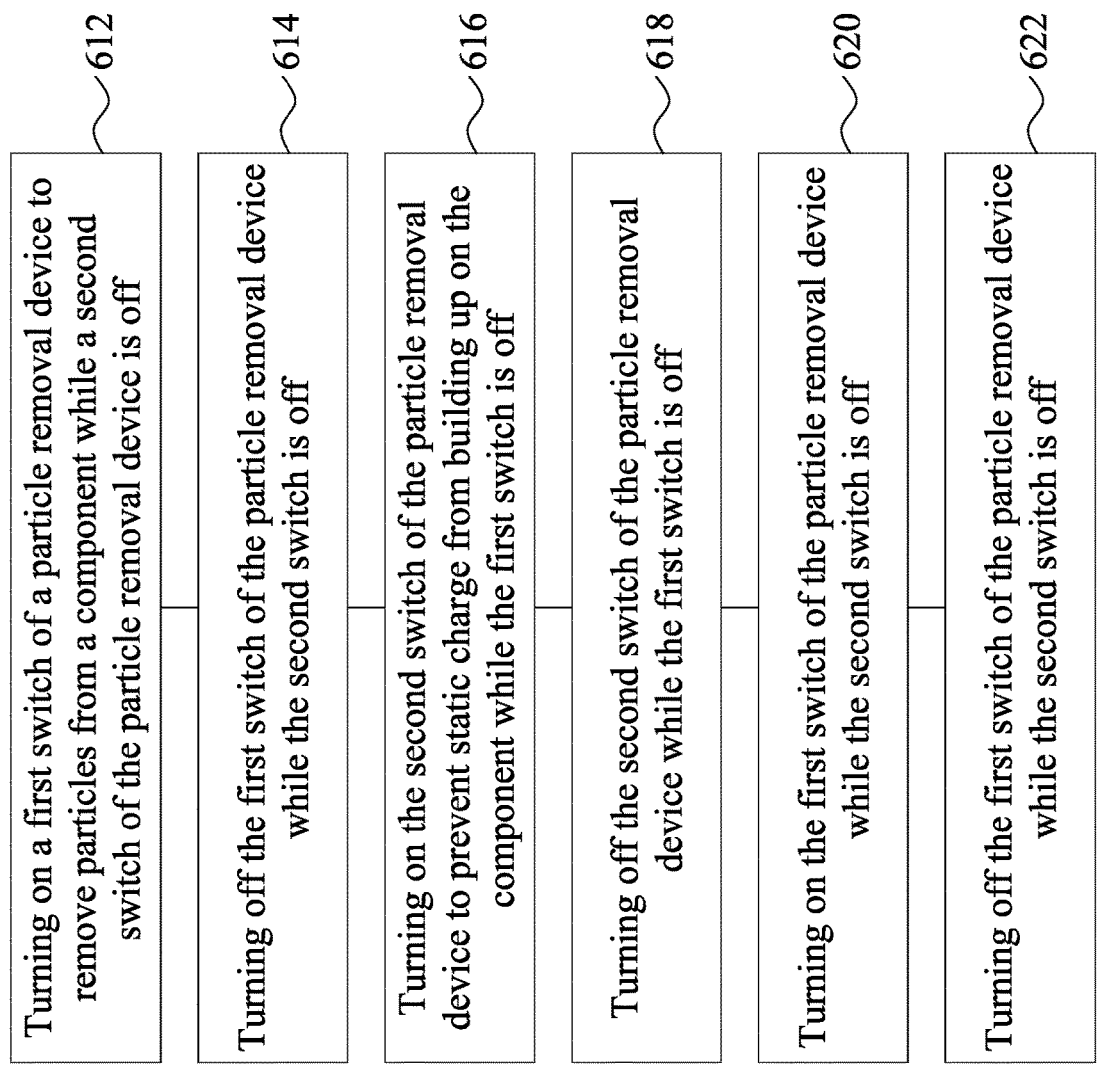

PARTICLE REMOVAL DEVICE AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

For example, there is a growing need to perform higher-resolution lithography processes. One lithography technique is extreme ultraviolet lithography (EUVL). The EUVL employs scanners using light in the extreme ultraviolet (EUV) region, having a wavelength of about 1 to 100 nanometers (nm). One type of EUV light source is laser-produced plasma (LPP). LPP technology produces EUV light by focusing a high-power laser beam onto small fuel target droplets to form highly ionized plasma that emits EUV radiation with a peak of maximum emission at 13.5 nm. The EUV light is then collected by a collector and reflected by optics towards a lithography exposure object, e.g., a substrate, such as a wafer.

The number of particles on the wafer is an important index in terms of EUV scanner performance. Therefore, there is a need for a solution for reducing particles on the components of the EUVL tool along the wafer path.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6C illustrate methods to remove particles from a component using the particle removal device, in accordance with some embodiments.

DETAILED DESCRIPTION

Figure 1:
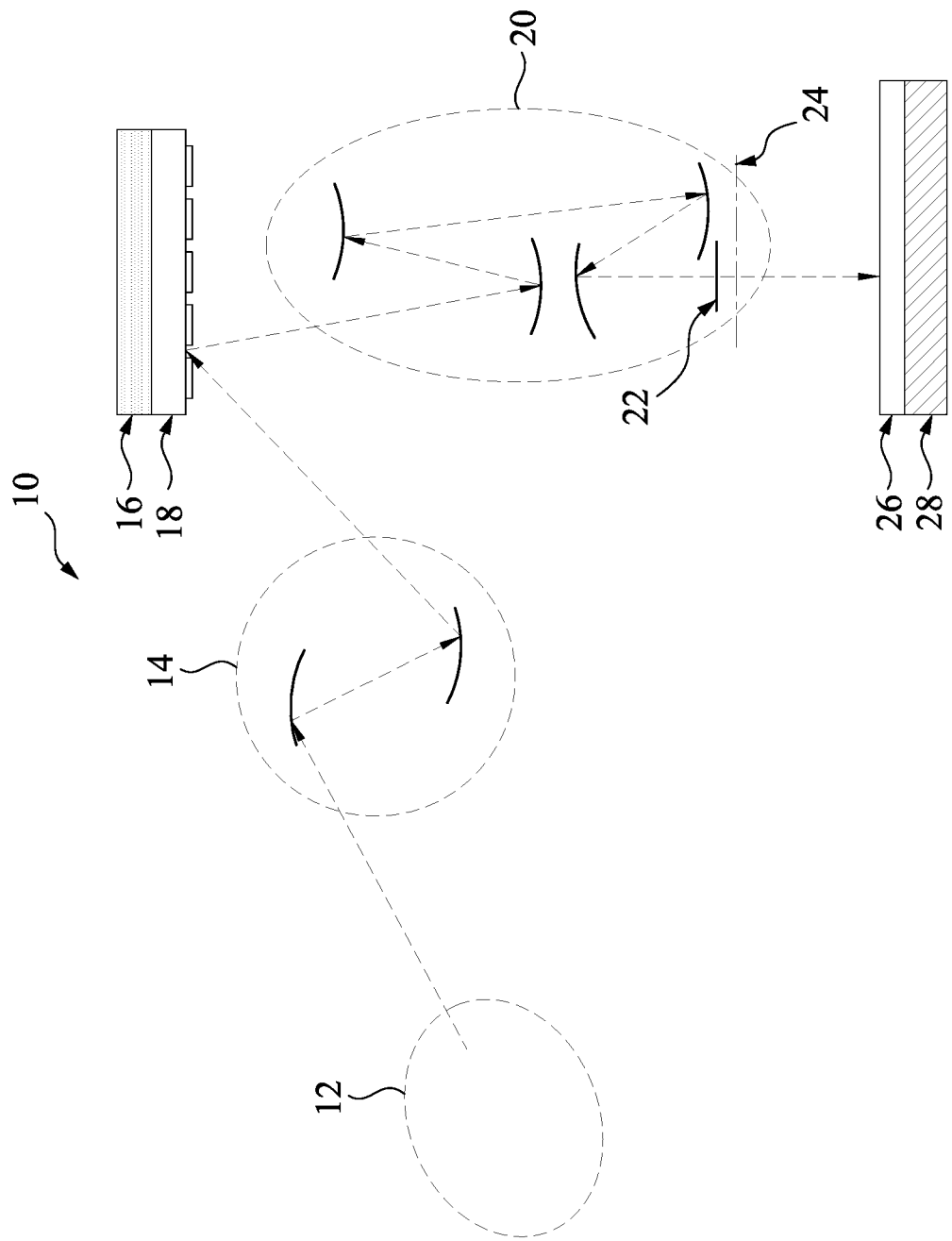
FIG. 1 is a schematic view of a lithography system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic view of a lithography system 10, in accordance with some embodiments. The lithography system 10 may also be generically referred to as a scanner that is operable to perform lithography exposing processes with respective radiation source and exposure mode. In the present embodiment, the lithography system 10 is an extreme ultraviolet (EUV) lithography system designed to expose a resist layer by EUV light. The resist layer is a material sensitive to the EUV light. The EUV lithography system 10 employs a radiation source 12 to generate EUV light, such as EUV light having a wavelength ranging between about 1 nm and about 100 nm. In one particular example, the radiation source 12 generates an EUV light with a wavelength centered at about 13.5 nm. Accordingly, the radiation source 12 is also referred to as EUV radiation source 12.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the radiation source 12 onto a mask stage 16, particularly to a mask 18 secured on the mask stage 16. In the present embodiment where the radiation source 12 generates light in the EUV wavelength range, the illuminator 14 employs reflective optics. In some embodiments, the illuminator 14 includes a dipole illumination component.

In some embodiments, the illuminator 14 is operable to configure the mirrors to provide a proper illumination to the mask 18. In one example, the mirrors of the illuminator 14 are switchable to reflect EUV light to different illumination positions. In some embodiment, a stage prior to the illuminator 14 may additionally include other switchable mirrors that are controllable to direct the EUV light to different illumination positions with the mirrors of the illuminator 14. In some embodiments, the illuminator 14 is configured to provide an on-axis illumination (ONI) to the mask 18. In an example, a disk illuminator 14 with partial coherence σ being at most 0.3 is employed. In some other embodiments, the illuminator 14 is configured to provide an off-axis illumination (OAI) to the mask 18. In an example, the illuminator 14 is a dipole illuminator. The dipole illuminator has a partial coherence σ of at most 0.3 in some embodiments.

The lithography system 10 also includes the mask stage 16 configured to secure a mask 18. In some embodiments, the mask stage 16 includes an electrostatic chuck (e-chuck) to secure the mask 18. This is because gas molecules absorb EUV light, and the lithography system for the EUV lithography patterning is maintained in a vacuum environment to avoid the EUV intensity loss. In the disclosure, the terms of mask, photomask, and reticle are used interchangeably to refer to the same item.

In the present embodiment, the lithography system 10 is an EUV lithography system, and the mask 18 is a reflective mask. One exemplary structure of the mask 18 is provided for illustration. The mask 18 includes a substrate with a suitable material, such as a low thermal expansion material (LTEM) or fused quartz. In various examples, the LTEM includes $TiO_2$, doped $SiO_2$, or other suitable materials with low thermal expansion.

The lithography system 10 also includes a projection optics module (or projection optics box (POB)) 20 for imaging the pattern of the mask 18 on to a semiconductor substrate 26 secured on a substrate stage 28 of the lithography system 10. The POB 20 has refractive optics (such as for UV lithography system) or alternatively reflective optics (such as for EUV lithography system) in various embodiments. The light directed from the mask 18, carrying the image of the pattern defined on the mask 18, is collected by the POB 20. The illuminator 14 and the POB 20 are collectively referred to as an optical module of the lithography system 10.

The lithography system 10 also includes a pupil phase modulator 22 to modulate optical phase of the light directed from the mask 18 so that the light has a phase distribution on a projection pupil plane 24. In the optical module, there is a plane with field distribution corresponding to Fourier Transform of the object (the mask 18 in the present case). This plane is referred to as projection pupil plane. The pupil phase modulator 22 provides a mechanism to modulate the optical phase of the light on the projection pupil plane 24. In some embodiments, the pupil phase modulator 22 includes a mechanism to tune the reflective mirrors of the POB 20 for phase modulation. For example, the mirrors of the POB 20 are switchable and are controlled to reflect the EUV light, thereby modulating the phase of the light through the POB 20.

In some embodiments, the pupil phase modulator 22 utilizes a pupil filter placed on the projection pupil plane. A pupil filter filters out specific spatial frequency components of the EUV light from the mask 18. Particularly, the pupil filter is a phase pupil filter that functions to modulate phase distribution of the light directed through the POB 20. However, utilizing a phase pupil filter may be limited in some lithography system (such as an EUV lithography system) since all materials absorb EUV light.

As discussed above, the lithography system 10 also includes the substrate stage 28 to secure a target semiconductor substrate 26 to be patterned. In the present embodiment, the semiconductor substrate is a semiconductor wafer, such as a silicon wafer or other type of wafer. The target semiconductor substrate 26 is coated with the resist layer sensitive to the radiation beam, such as EUV light in the present embodiment. Various components including those described above are integrated together and are operable to perform lithography exposing processes. The lithography system 10 may further include other modules or be integrated with (or be coupled with) other modules.

The lithography system 10 may be cleaned after being used for a predetermined period of time. The cleaning of the lithography system 10 may include removing particles from the path of the semiconductor substrate 26. For example, the substrate stage 28 may be cleaned using a vacuum cleaner. The vacuum cleaner has a brush made of plastic. The substrate stage 28 may include metallic and non-metallic parts. Thus, when cleaning the substrate stage 28 with the vacuum cleaner, static electricity may buildup on and/or within the substrate stage 28 from using the plastic brush of the vacuum cleaner to clean the non-metallic part of the substrate stage 28. The substrate stage 28 charged with static electricity can easily attract particles from the surroundings. In order to improve the cleaning process of the lithography system 10 and to reduce the particles on the substrate path, a particle removal device 100 is utilized.

Figure 2A:
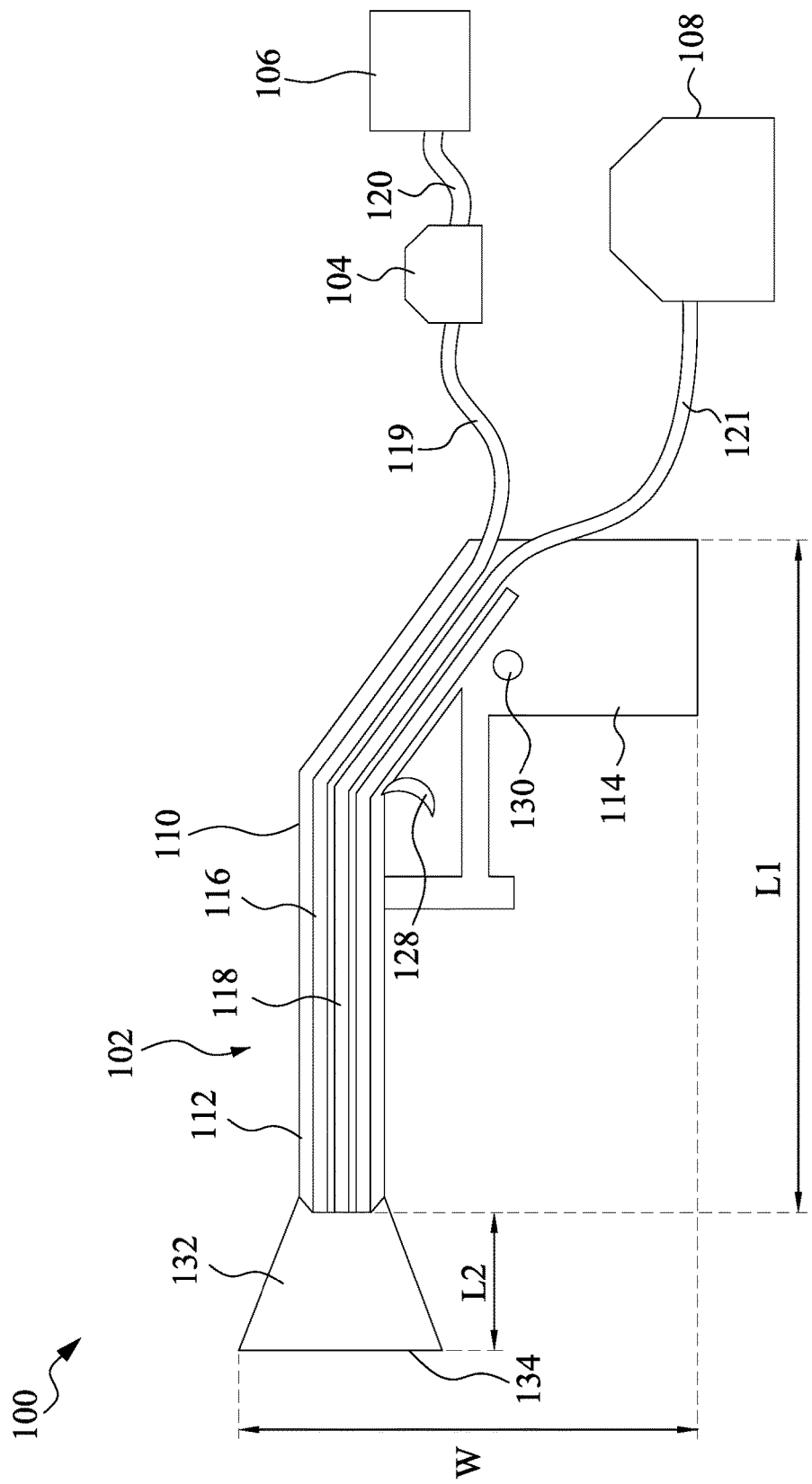
FIGS. 2A-2C are schematic views of a particle removal device, in accordance with some embodiments.
Figure 2B:
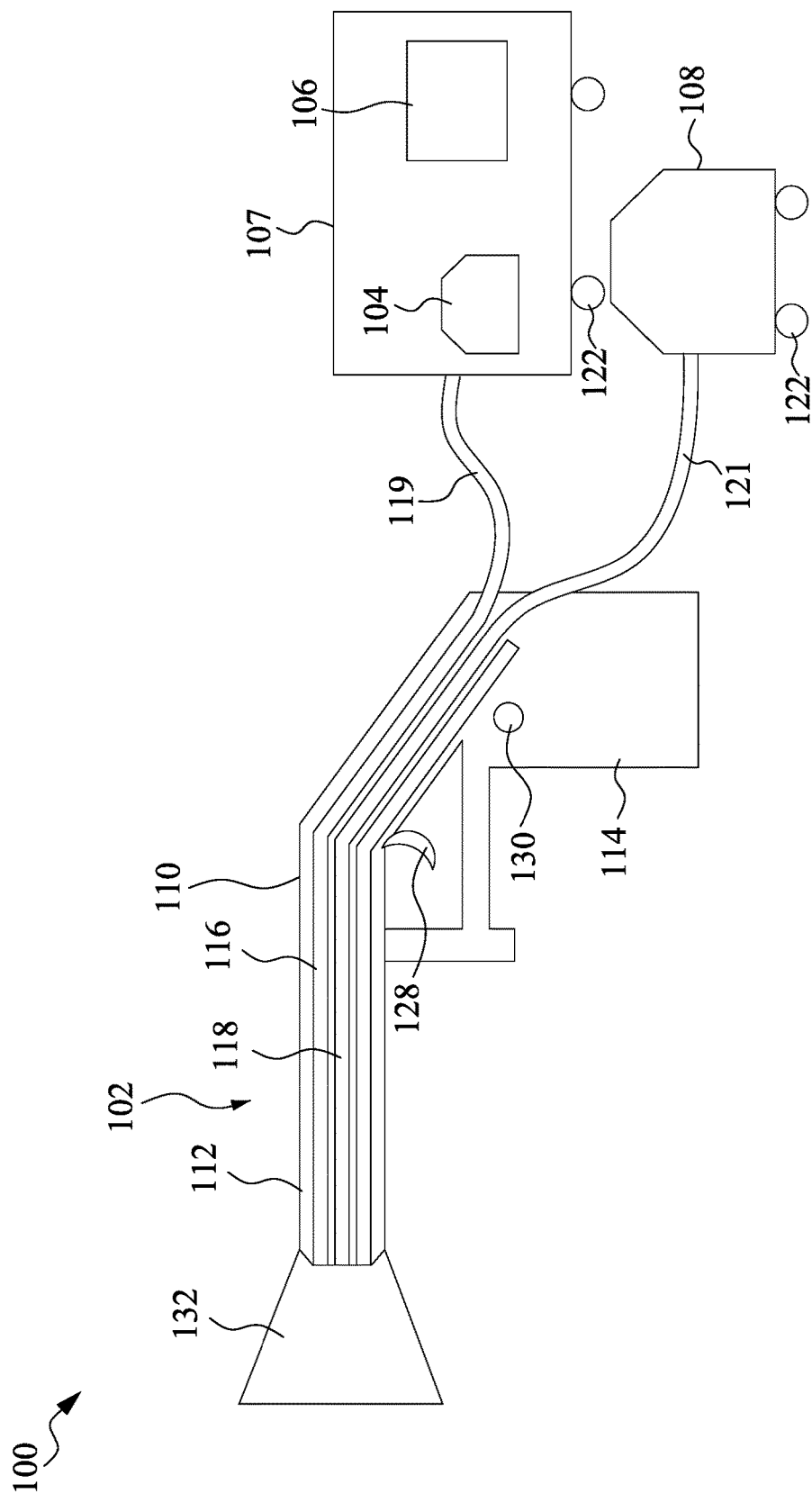
Figure 2C:
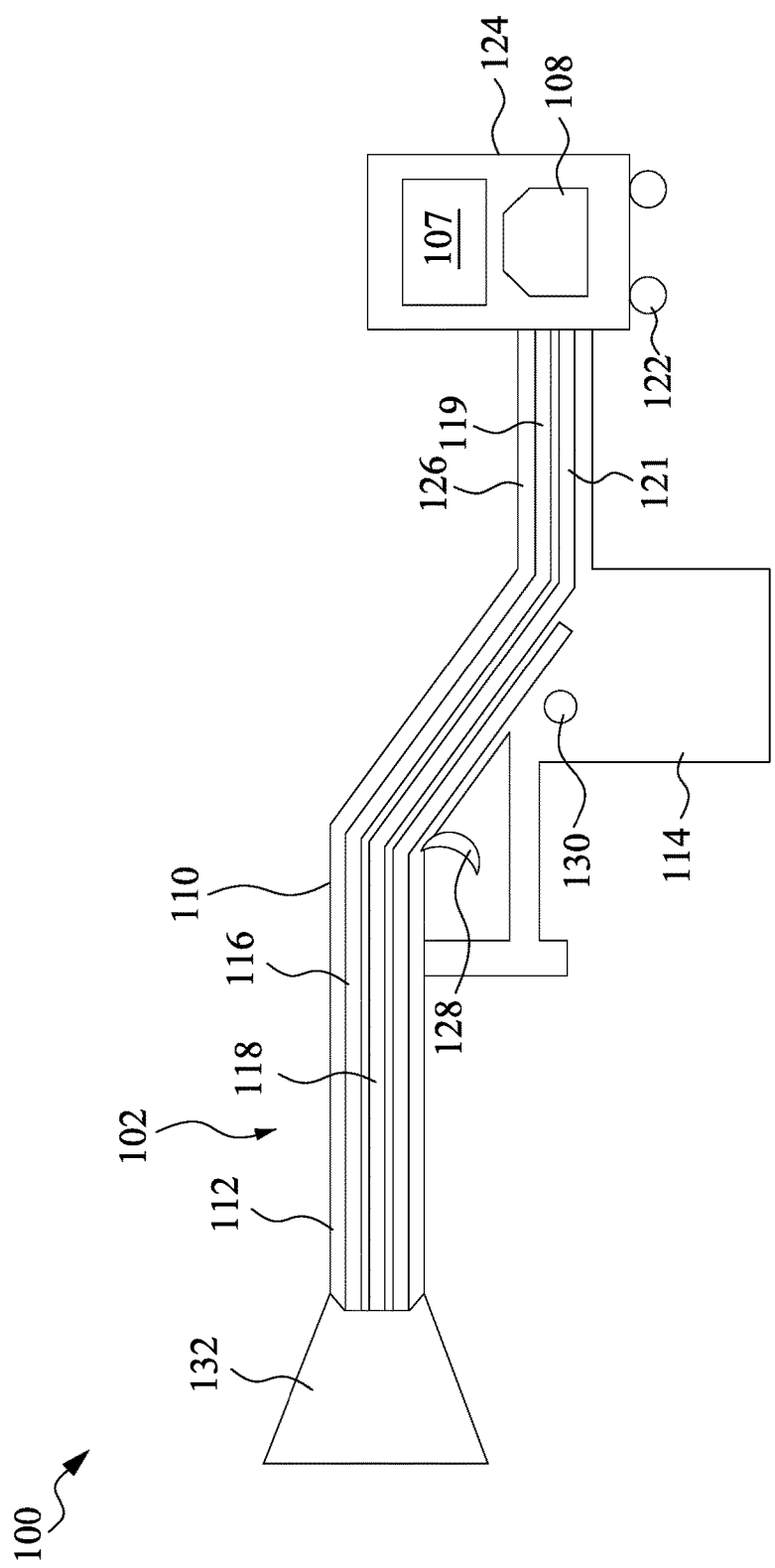

FIGS. 2A-2C are schematic views of the particle removal device 100, in accordance with some embodiments. As shown in FIG. 2A, the particle removal device 100 includes a handheld module 102, an ion generator 104, a fluid generator 106, and a suction module 108. The handheld module 102 may include a body 110 having a nozzle 112 on one end and a handle 114 on the opposite end. In some embodiments, as shown in FIG. 2A, the handle 114 may be angled with respect to the longitudinal axis of the nozzle 112. In some embodiments, the handle 114 may be located along the longitudinal axis of the nozzle 112. The handheld module 102 may have dimensions that fits the hand of an operator. In some embodiments, the handheld module 102 has a length L1 ranging from about 140 mm to about 160 mm and a width W ranging from about 150 mm to about 250 mm. A first one or more channels 116 and a second one or more channels 118 are disposed in the body 110 of the handheld module 102. The first one or more channels 116 are not in fluid communication with the second one or more channels 118. The first one or more channels 116 are connected to the ion generator 104, which is connected to the fluid generator 106. The ion generator 104 and the fluid generator 106 are configured to inject ionized molecules, such as ionized air molecules, into the handheld module 102 and out of the nozzle 112.

In some embodiments, the ion generator 104 may be an ionizer, such as an AC ionizer, a pulsed DC ionizer, a steady-state DC ionizer, or other suitable ion generating device. The ion generator 104 may be able to generate positive ions, negative ions, both positive and negative ions at the same time, or alternating positive and negative ions. The fluid generator 106 is configured to provide a fluid stream to the ion generator 104, and the ion generator 104 ionizes the molecules in the fluid stream. The fluid generator 106 may include a filter to remove any particles in the fluid stream. The fluid generator 106 may be configured to control the humidity of the fluid stream. In some embodiments, the fluid generator 106 is configured to provide filtered fluid stream at a pressure greater than about 30 pounds per square inch (psi), such as from about 30 psi to about 60 psi. In some embodiments, the fluid generator 106 is an air generator, such as a fan, a blower, or a compressor. For example, air molecules in an air stream generated by the fluid generator 106 are ionized by the ion generator 104 and then carried to the handheld module 102 by the air stream. In some embodiments, the ion generator 104 and the fluid generator 106 are integrated in a single device, such as an ion blower 107, as shown in FIG. 2B. The combination of the fluid generator 106 and the ion generator 104 or the ion blower 107 may be configured to provide filtered fluid stream at a pressure greater than about 30 psi, such as from about 30 psi to about 60 psi.

As shown in FIGS. 2A and 2B, the first one or more channels 116 in the handheld module 102 may be connected to the ion generator 104 or the ion blower 107 by a first tubing 119, and the ion generator 104 may be connected to the fluid generator 106 by a second tubing 120. The first tubing 119 may be in fluid communication with the first one or more channels 116. The first tubing 119 may be made of a flexible material, such as plastic. In some embodiments, the first tubing 119 is made of flexible polyvinyl chloride (PVC), vinyl, polyurethane, polyethylene, nylon, or other suitable material. In some embodiment, the first tubing 119 is a flexible hose. The size of the first tubing 119 may be chosen so the fluid stream flowing therethrough has a pressure ranging from about 30 psi to about 60 psi. In some embodiments, the inner diameter of the first tubing 119 ranges from about ⅛ of an inch to about ⅝ of an inch. The second tubing 120 may be made of the same material as the first tubing 119 and may have the same size as the first tubing 119.

As shown in FIGS. 2A and 2B, the second one or more channels 118 in the handheld module 102 are connected to the suction module 108. The suction module 108 may be any device that can create suction, such as a vacuum cleaner. The suction module 108 may generate suction force greater than the injection force generated by the fluid generator 106. In other words, the volumetric flow rate of the fluid being sucked into the handheld module 102 is substantially greater than the volumetric flow rate of the ionized fluid stream injected by the handheld module 102. In some embodiments, the suction module 108 is configured to generate suction greater than about 60 psi. In some embodiments, both the suction module 108 and the ion blower 107 (or the ion generator 104 and the fluid generator 106) are on during operation and having the suction force greater than the injection force ensures that particles are sucked into the handheld module 102. Thus, the handheld module 102 is configured to inject or blow ionized fluid out of the nozzle 112 and to pump or suck particles into the nozzle 112. In some embodiments, the handheld module 102 is an ionized fluid blow/suction gun, such as an ionized air blow/suction gun. In some embodiments, as shown in FIGS. 2A and 2B, the suction module 108 is separated from the ion generator 104 and the fluid generator 106 (or the ion blower 107). In some embodiments, as shown in FIG. 2C, the suction module 108 and the ion blower 107 are integrated in a single device, such as an antistatic suction module 124.

In some embodiments, as shown in FIG. 2A, the fluid generator 106 and the suction module 108 may be stationary, and the handheld module 102 is connected to the suction module 108 by a third tubing 121. The third tubing 121 may be connected to and in fluid communication with the second one or more channels 118. The third tubing 121 may be made of the same material as the first tubing 119. The size of the third tubing 121 may be chosen so the suction generated by the suction module 108 at the nozzle 112 of the handheld module 102 is greater than about 60 psi. In some embodiments, the inner diameter of the third tubing 121 ranges from about 9.5 mm to about 10.5 mm. The third tubing 121 may be removably attached to the handheld module 102 and the suction module 108, and the length of the second tubing 120 may be determined by the distance between the stationary suction module 108 and the component to be cleaned, such as components of the lithography system 10. The ion generator 104 may be mobile or stationary. In some embodiments, the ion generator 104 is mobile, and the length of the first tubing 119 is substantially less than the length of the second tubing 120. In other words, the ion generator 104 is closer to the handheld module 102 than the fluid generator 106. In some embodiments, the ion generator 104 is stationary, and the length of the first tubing 119 is substantially greater than the length of the second tubing 120. The lengths of the first tubing 119 and the second tubing 120 may be determined by the distance between the stationary fluid generator 106 and the components to be cleaned. In some embodiments, the ion generator 104 is attached to the fluid generator 106 with or without the second tubing 120.

As shown in FIG. 2B, in some embodiments, the ion blower 107 and the suction module 108 are mobile. For example, the ion blower 107 and the suction module 108 each may include one or more moving devices 122, such as one or more wheels. The one or more moving devices 122 may be passive or motorized. In some embodiments, the one or more moving devices 122 are passive, and the ion blower 107 and the suction module 108 are moved by an operator pulling the first tubing 119 and the third tubing 121. In some embodiments, the one or more moving devices 122 are motorized, and the operator may be able to control the speed and the direction of the ion blower 107 and the suction module 108 using a remote control. In some embodiments, the ion blower 107 and the suction module 108 each includes one or more cameras and/or sensors to autonomously follow the operator. In some embodiments, the ion blower 107 and the suction module 108 are stationary. The first tubing 119 may be removably attached to the handheld module 102 and the ion blower 107, and the third tubing 121 may be removably attached to the handheld module 102 and the suction module 108.

As shown in FIG. 2C, the antistatic suction module 124 may be mobile. For example, the antistatic suction module 124 may include the one or more moving devices 122. The first tubing 119 and the third tubing 121 may be removably attached to the handheld module 102 and the antistatic suction module 124. The first tubing 119 and the third tubing 121 may be covered by a shell 126. The shell 126 may be made of a flexible material, such as plastic. In some embodiments, the shell 126 is a bellow. The shell 126 may be also removably attached to the handheld module 102 and the antistatic suction module 124. In some embodiments, the antistatic suction module 124 is stationary, and the lengths of the first tubing 119, the third tubing 121, and the shell 126 may be determined by the distance between the stationary antistatic suction module 124 and the components to be cleaned.

As shown in FIGS. 2A-2C, the handheld module 102 may include an injection switch 128 and a suction switch 130. In some embodiments, the injection switch 128 may be configured to control the ionized fluid stream generated by the ion generator 104 and the fluid generator 106 (or the ion blower 107), and the suction switch 130 may be configured to control the suction generated by the suction module 108. In some embodiments, the suction switch 130 for controlling the suction generated by the suction module 108 may be not present on the handheld module 102, and a switch located on the suction module 108 is used to turn on and off the suction module 108 and to control the suction by the handheld module 102. The injection switch 128 and the suction switch 130 each may be any suitable switch, such as a trigger, a push button, or a flip. In some embodiments, the injection switch 128 and the suction switch 130 may be different, as shown in FIGS. 2A-2C. For example, the injection switch 128 is a trigger, and the suction switch 130 is a push button.

The injection switch 128 and the suction switch 130 may include the same type of switch, in some embodiments. In some embodiments, the injection switch 128 and the suction switch 130 may be push buttons or triggers. The handheld module 102 may further includes a cup 132 attached to the nozzle 112, as shown in FIGS. 2A-2C. The cup 132 may be removably attached to the nozzle 112. The cup 132 may be utilized to restrict the cleaning zone. The cup 132 may have a length L2 ranging from about 90 mm to about 110 mm. The cup 132 may be made of an antistatic material, such as nitrile rubber or nitrile butadiene rubber.

Figure 3C:
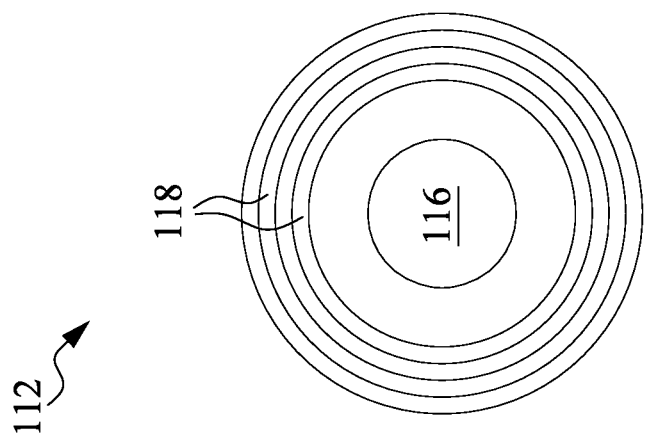
FIGS. 3A-3C are schematic views of an end of a nozzle of the particle removal device of FIGS. 2A and 2B, in accordance with some embodiments.
Figure 3B:
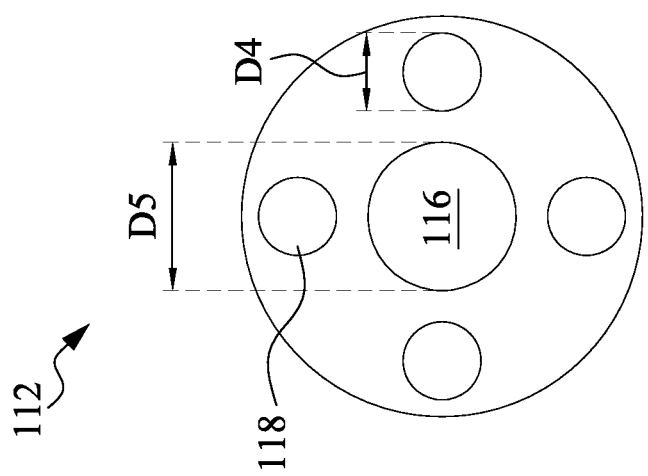
Figure 3A:
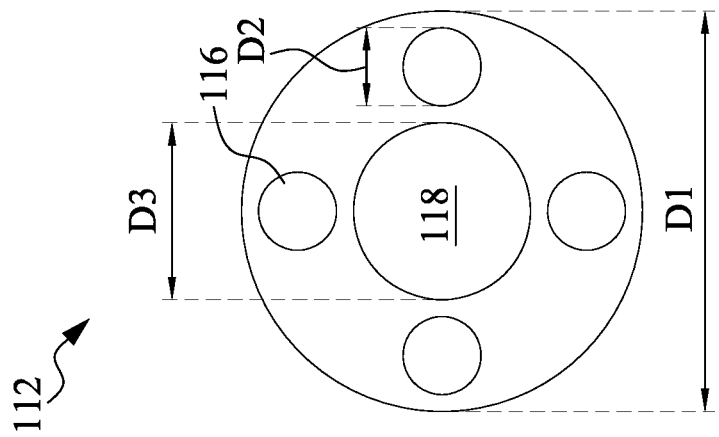

FIGS. 3A-3C are schematic views of an end of the nozzle 112 of the particle removal device 100 of FIGS. 2A-2C, in accordance with some embodiments. In some embodiments, as shown in FIG. 3A, the nozzle 112 may have a circular cross section and a diameter D1 ranging from about 30 mm to about 35 mm. The cross-sectional shape of the nozzle 112 may be any suitable shape other than circular. The first one or more channels 116 and the second one or more channels 118 are formed in the handheld module 102. As shown in FIG. 3A, the first one or more channels 116 include four channels 116, and the second one or more channels 118 include one channel 118. The four channels 116 may be disposed around the channel 118, and the four channels 116 may be equal distance apart from each other. In some embodiments, each channel 116 has a circular cross section and a diameter D2 ranging from about 1 mm to about 10 mm, and each channel 118 has a circular cross section and a diameter D3 ranging from about 5 mm to about 15 mm. As described above, in some embodiments, the suction force at the nozzle 112 is greater than the injection force at the nozzle 112. Thus, in some embodiments, the total cross-sectional area of the second one or more channels 118, which are connected to the suction module 108 (FIGS. 2A-2C), is greater than the total cross-sectional area of the first one or more channels 116, which are connected to the fluid generator 106 (FIGS. 2A-2C). For example, the total cross-sectional area of the four channels 116 is less than the cross-sectional area of the channel 118, as shown in FIG. 3A. The cross-sectional shape of the first one or more channels 116 and the second one or more channels 118 may be any suitable shape other than circular.

In some embodiments, as shown in FIG. 3B, the first one or more channels 116 include one channel 116, and the second one or more channels 118 include four channel 118. The four channels 118 may be disposed around the channel 116, and the four channels 118 may be equal distance apart from each other. In some embodiments, each channel 118 has a circular cross section and a diameter D4 ranging from about 5 mm to about 10 mm, and the channel 116 has a circular cross section and a diameter D5 ranging from about 5 mm to about 15 mm. In some embodiments, the total cross-sectional area of the four channels 118 is greater than the cross-sectional area of the channel 116, as shown in FIG. 3B. In some embodiments, as shown in FIG. 3C, the first one or more channels 116 include one channel 116. The second one or more channels 118 may include one or more channels 118 each having an annular shape. The annular channels 118 may surround the channel 116, and the annular channels 118 and the channel 116 may be concentric. The size of the annular channels 118 may be determined so the total cross-sectional area of the second one or more channels 118 is greater than the cross-sectional area of the channel 116, as shown in FIG. 3C.

Figure 4B:
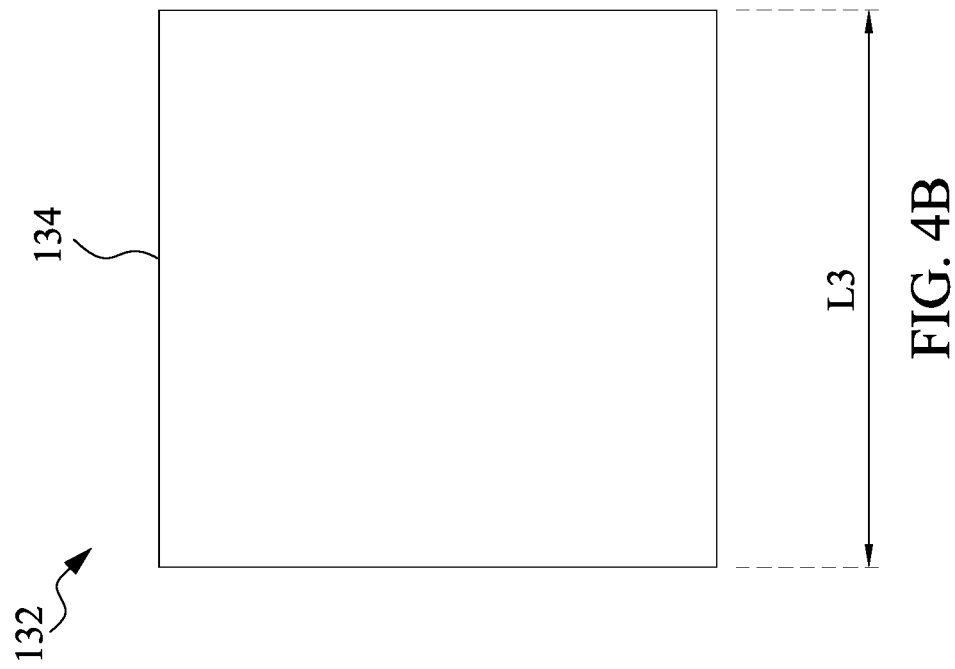
FIGS. 4A and 4B are schematic views of an end of a cup of the particle removal device of FIGS. 2A and 2B, in accordance with some embodiments.
Figure 4A:
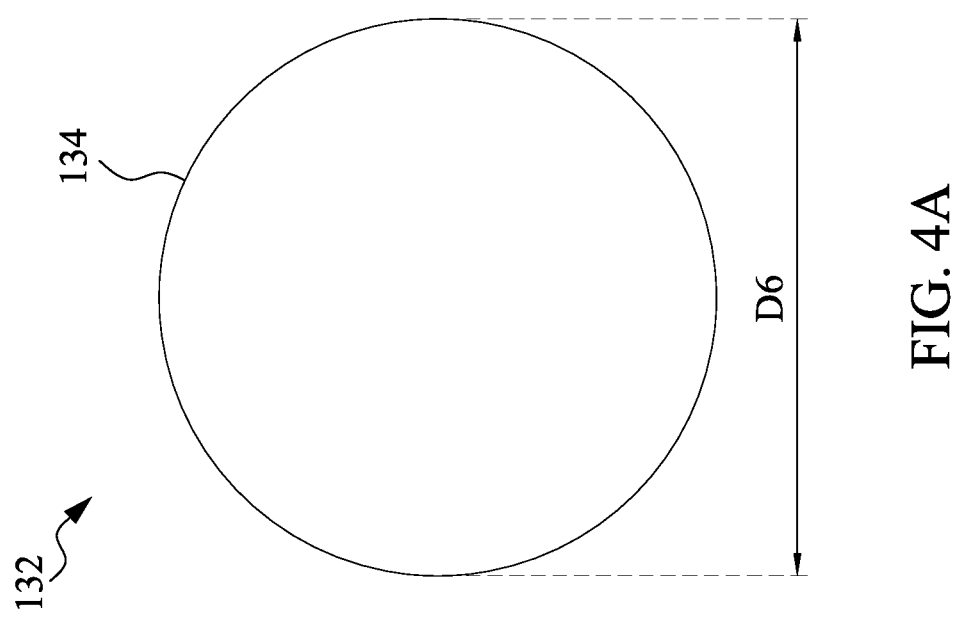

FIGS. 4A and 4B are schematic views of an end 134 of the cup 132 of the particle removal device 100 of FIGS. 2A-2C, in accordance with some embodiments. As shown in FIG. 4A, the cup 132 includes the end 134 having a circular cross section. The end 134 may have a diameter D6 ranging from about 140 mm to about 160 mm. The end 134 may have other suitable cross-sectional shape. In some embodiments, the end 134 has a square cross section, as shown in FIG. 4B. The square end 134 of the cup 132 may have a length L3 ranging from about 140 mm to about 160 mm. The cup 132 of the handheld module 102 may be utilized to restrict the cleaning zone. Thus, if the cross-sectional area of the end 134 of the cup 132 is too large, particles under the cup 132 may not be sucked in or pumped out by the handheld module 102. On the other hand, if the cross-sectional area of the end 134 of the cup 132 is too small, the cleaning of the components may not be efficient.

Figure 5:
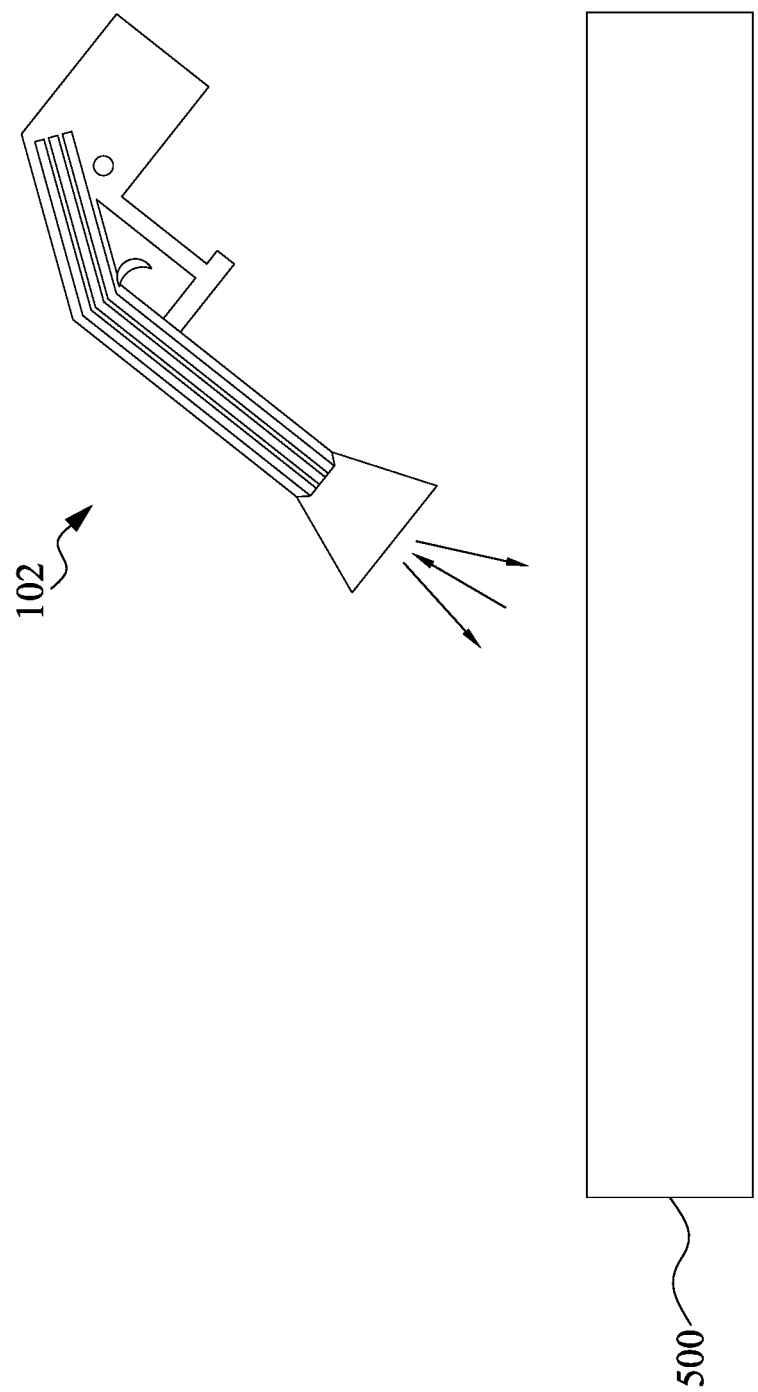
FIG. 5 schematically illustrates the particle removal device removing particles from a component of a system, in accordance with some embodiments.

FIG. 5 schematically illustrates the handheld module 102 of the particle removal device 100 removing particles from a component 500 of a tool, in accordance with some embodiments. In some embodiments, the component 500 may be the substrate stage 28 of the lithography system 10. The component 500 includes non-metallic parts. The component 500 may be any suitable component that may have particles accumulated thereon. In some embodiments, the component 500 may be a substrate support in a semiconductor processing chamber, such as a chemical vapor deposition (CVD) chamber, physical vapor deposition (PVD) chamber, atomic layer deposition (ALD) chamber, or etch chamber. In some embodiments, the component 500 is an electrostatic chuck. During cleaning, the operator may hold the handheld module 102 over the component 500 to inject or blow ionized fluid onto the component 500 and to remove particles from the component 500 by sucking the particles into the handheld module 102, as indicated by the arrows shown in FIG. 5. The ion injection and the sucking by the handheld module 102 may be performed simultaneously or alternately. The particles are sucked out by the handheld module 102, and the ion injection prevents and/or eliminates static electricity from the component 500. Without static electricity on the component 500, particles in the vicinity of the component 500 may not be attracted to the component 500. In some embodiments, the suction is stopped after the ion injection is stopped to ensure particles are removed from the component 500. In some embodiments, the suction module 108 is constantly on, and the operator uses the injection switch 128 to control the injection of the ionized fluid stream.

Figure 6A:
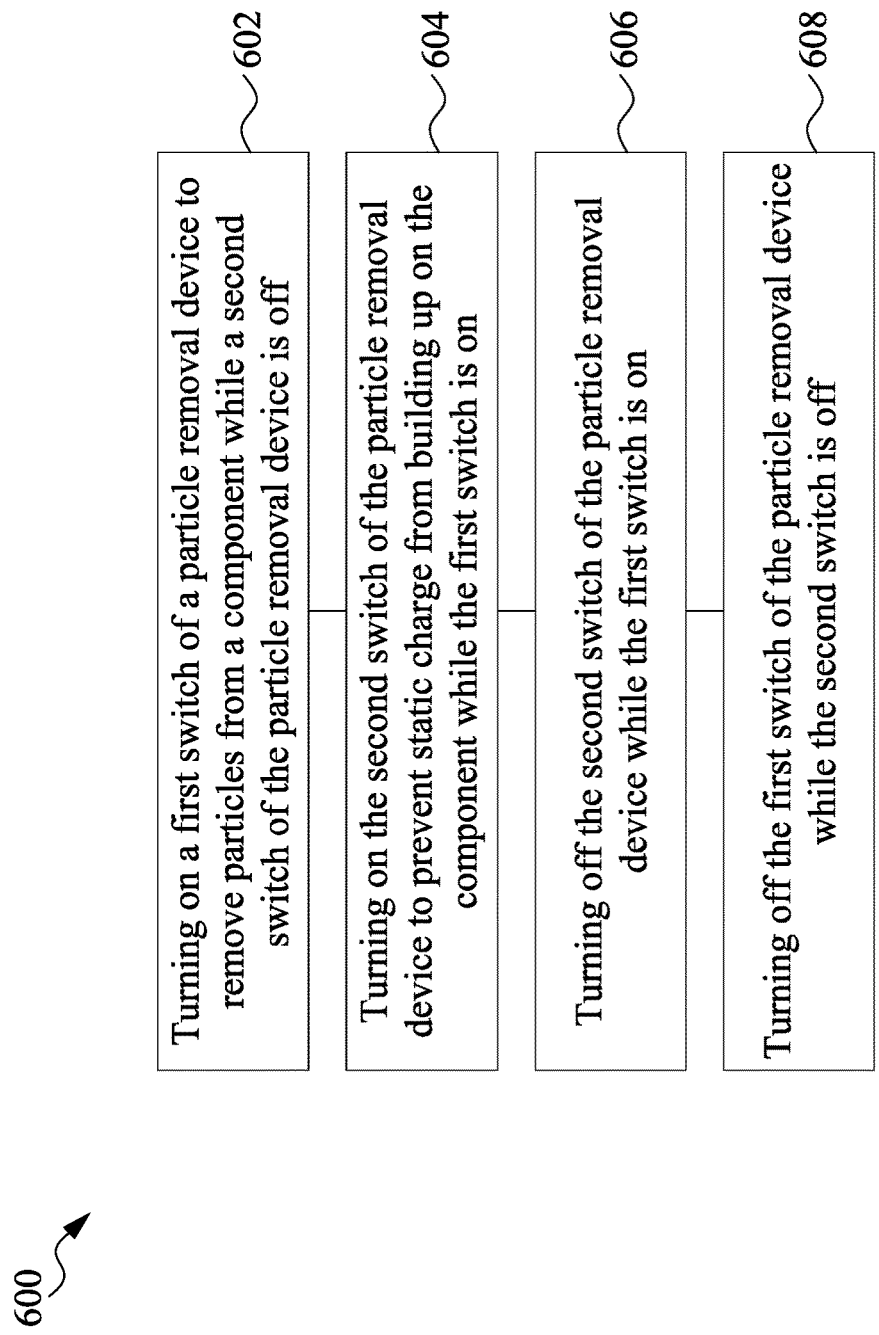
Figure 6C:
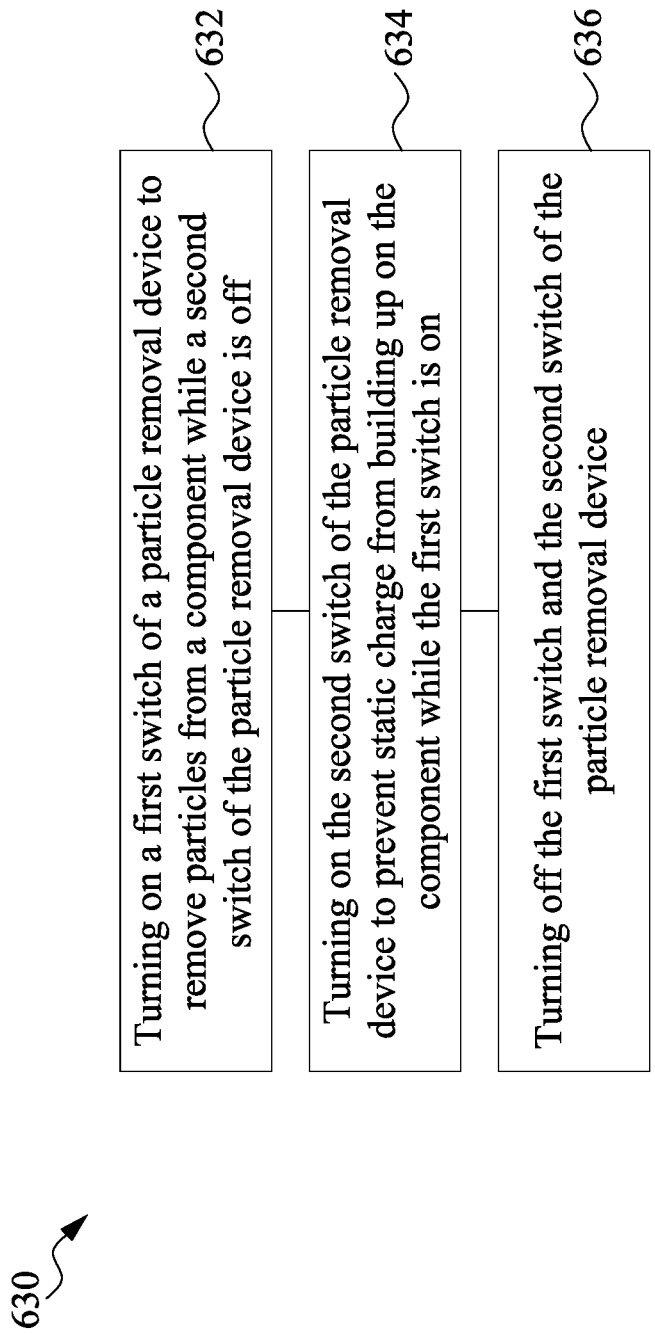

FIGS. 6A-6C illustrate methods to remove particles from a component 500 using the particle removal device 100, in accordance with some embodiments. As shown in FIG. 6A, a method 600 starts at operation 602, which is turning on a first switch of a particle removal device to remove particles from a component while a second switch of the particle removal device is off. The first switch may be the suction switch 130 located on the handheld module 102. In some embodiments, the first switch is located on the suction module 108. The second switch may be the injection switch 128 located on the handheld module 102. The particle removal device may be the particle removal device 100, and the component may be the component 500. For example, an operator turns on the first switch, such as the suction switch 130 or a switch on the suction module 108, and places the handheld module 102 over the component to remove particles from the component by providing suction through the nozzle 112. The second switch located on the handheld module 102, which is utilized to control the ion injection, may be off.

Next, at operation 604, the second switch is turned on to prevent static charge from building up on the component while the first switch is on. For example, the operator turns on the second switch, which may be the injection switch 128, to inject ionized fluid stream from the nozzle 112 to the component while the handheld module 102 continues to provide suction through the nozzle 112. The ionized fluid stream, such as ionized air, may prevent and/or eliminate static charge from building up on the component. Next, at operation 606, the second switch is turned off while the first switch is on. For example, the operator turns off the second switch to stop injecting ionized fluid stream on the component while the handheld module 102 continues to provide suction through the nozzle 112. Next, at operation 608, the first switch is turned off while the second switch is off. For example, the operator turns off the first switch to stop the suction provided by the nozzle 112.

FIG. 6B illustrate a method 610 according to alternate embodiments. The method 610 starts at operation 612, which may be the same as the operation 602. Next, at operation 614, the first switch is turned off while the second switch is off. For example, the operator turns off the first switch to stop the suction provided by the nozzle 112 of the handheld module 102 of the particle removal device 100 while the second switch is off. Next, at operation 616, the second switch is turned on to prevent static charge from building up on the component while the first switch is off. For example, the operator turns on the second switch, which may be the injection switch 128, to inject ionized fluid stream from the nozzle 112 to the component while no suction is provided through the nozzle 112. Next, at operation 618, the second switch is turned off while the first switch is off. For example, the operator turns off the second switch to stop injecting ionized fluid stream on the component while the suction is off. Next, at operation 620, the first switch is turned on while the second switch is off. For example, the operator turns on the first switch to provide suction through the nozzle 112 while the ionized fluid stream is not injected on the component. Next, at operation 622, the first switch is turned off while the second switch is off. For example, the operator turns off the first switch to stop the suction provided by the nozzle 112 while the ionized fluid stream is not injected on the component.

FIG. 6C illustrate a method 630 according to alternate embodiments. The method 630 starts at operation 632, which may be the same as the operation 602. Next, at operation 634, the second switch is turned on to prevent static charge from building up on the component while first switch is on. For example, the operator turns on the second switch, which may be the injection switch 128, to inject ionized fluid stream from the nozzle 112 to the component while the nozzle 112 continues providing suction. Next, at operation 636, the first switch and the second switch are turned off. For example, the operator turns off both the first switch and the second switch to stop injecting ionized fluid stream on the component and to stop the suction. In some embodiments, the first switch and the second switch may be turned off simultaneously. In some embodiments, the first switch is turned off just after turning off the second switch.

The methods 600, 610, 630 describe how to remove particles from a component of a lithography system without generating static charge using the particle removal device 100. In some embodiments, a particle measuring process is performed before and after each of the method 600, 610, 630. For example, a first number of particles on the component may be measured using any suitable particle measuring device or method prior to performing the method 600, 610, 630. After performing the method 600, 610, 630, a second number of particles on the component may be measured using any suitable particle measuring device or method. The second number is substantially less than the first number.

Figure 7:
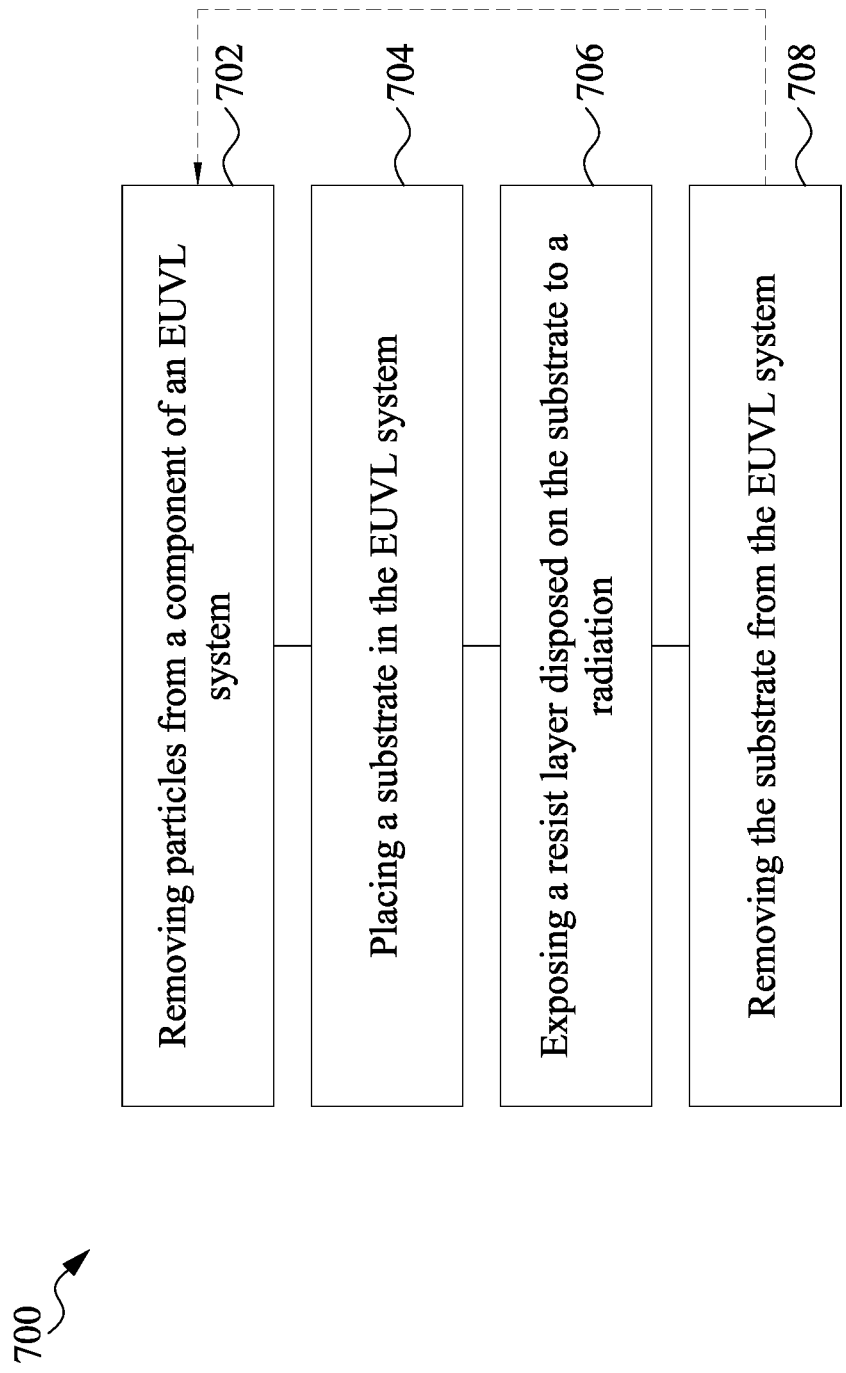
FIG. 7 illustrates a method for fabricating a substrate, in accordance with some embodiments.

FIG. 7 illustrates a method 700 for fabricating a substrate in accordance with some embodiments. It is noted that the operations of the method 700, including any descriptions given with reference to the figures, are merely exemplary and are not intended to be limiting beyond what is specifically recited in the claims that follow. Additional operations may be implemented before, during, and after the method 700, and some operations may be replaced or eliminated in accordance with various embodiments of the method 700.

At operation 702, particles are removed from a component of an EUVL system. The particle removal process may be the particle removal processes described in FIGS. 6A-6C. While the EUVL system is discussed, it is contemplated that the particle removal process may be performed in any system capable of performing advanced lithography processes, such as DUV lithography, e-beam lithography, or x-ray lithography. The component may be the substrate stage in the EUVL system, such as the substrate stage 28 shown in FIG. 1.

At operation 704, after removing particles from the component of the EUVL system, a substrate is placed in the EUVL system. The substrate may be the substrate 26 shown in FIG. 1. The substrate may include a resist layer formed thereon.

At operation 706, the resist layer is exposed to patterned radiation emitted from a radiation source, such as the radiation source 12 shown in FIG. 1. The exposure may render the resist layer more soluble in a developer, thereby producing a positive-tone image pattern. Conversely, the resist layer may become less soluble upon exposure, resulting in generation of a negative-tone image pattern.

At operation 708, the substrate is removed from the EUVL system. Additional processes may be performed on the substrate to form a patterned resist layer, such as a post exposure baking process and developing process. After the removal of the substrate from the EUVL process, the method 700 may be repeated at operation 702, in some embodiments.

The present disclosure in various embodiments provides a particle removal device 100. The particle removal device includes a handheld module 102 configured to provide suction and to inject ionized fluid stream. Some embodiments may achieve advantages. For example, the particle removal device 100 may be used to remove particles from a substrate stage 28 of a lithography system 10. The handheld module 102 of the particle removal device 100 can inject ionized fluid stream on the substrate stage 28 to prevent static charge from building up on the substrate stage 28 and to provide suction to remove particles from the substrate stage 28. Without static charge on the substrate stage 28, particles in the vicinity of the substrate stage 28 are not attracted to the substrate stage 28. As a result, particles are removed from the substrate stage 28 more efficiently.

An embodiment is a particle removal device. The device includes a handheld module having a body. A first one or more channels and a second one or more channels are formed in the body. The body includes a nozzle, and the handheld module is configured to provide suction by the nozzle and to inject an ionized fluid stream by the nozzle. The body further includes a handle attached to the nozzle.

Another embodiment is a particle removal device. The device includes a handheld module including a body, and a first one or more channels and a second one or more channels are formed in the body. The device further includes a first tubing attached to the handheld module, and the first tubing is connected to the first one or more channels. The device further includes an ion generator connected to the first tubing, a second tubing attached to the handheld module, and a suction module connected to the second tubing. The second tubing is connected to the second one or more channels.

A further embodiment is a method. The method includes placing a handheld module of a particle removal device over a component, turning on a first switch to remove particles from the component by providing suction through a nozzle of the handheld module, and turning on a second switch located on the handheld module to prevent static charge from building up on the component by injecting ionized fluid stream from the nozzle of the handheld module.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A particle removal device, comprising:
    a handheld module, comprising:
        a body, wherein a plurality of first channels and a second channel are formed in the body, the plurality of first channels are disposed around the second channel, and a total cross-sectional area of the plurality of first channels is greater than a cross-sectional area of the second channel, wherein the body comprises:
            a nozzle, wherein the handheld module is configured to provide suction by the nozzle and to inject an ionized fluid stream by the nozzle, and wherein the suction is provided via the plurality of first channels and the ionized fluid stream injection is via the second channel; and
            a handle attached to the nozzle; and
        a cup extending from the body, wherein the cup comprises a nitrile based material, and the cup has an end having a diameter ranging from about 140 mm to about 160 mm.

2. The particle removal device of claim 1, wherein the handle is angled with respect to a longitudinal axis of the nozzle.

3. The particle removal device of claim 2, wherein the second channel has a cross-sectional area ranging from about 5 mm to about 15 mm.

4. The particle removal device of claim 1, wherein each of the plurality of first one or more channels has a circular cross section, and the second channel has a circular cross section.

5. The particle removal device of claim 1, wherein the handheld module further comprises:
    a first switch; and
    a second switch.

6. The particle removal device of claim 1, wherein each of the plurality of first channels has a cross-sectional area ranging from about 5 mm to about 10 mm.

7. The particle removal device of claim 1, wherein the nozzle is configured to provide a greater suction force than an injection force.

8. A particle removal device, comprising:
    a handheld module, comprising:
        a body, wherein a first one or more channels and a second one or more channels are formed in the body;
        a first tubing attached to the handheld module, wherein a first end of the first tubing is connected to the first one or more channels;
        an ion blower connected to a second end of the first tubing opposite the first end, wherein the ion blower is mobile and comprises an ion generator and a fluid generator;
        a second tubing attached to the handheld module, wherein a first end of the second tubing is connected to the second one or more channels; and
        a suction module connected to a second end of the second tubing opposite the first end.

9. The particle removal device of claim 8, wherein the suction module is a vacuum cleaner.

10. The particle removal device of claim 8, wherein the first one or more channels include one channel, and the second one or more channels include a plurality of channels.

11. The particle removal device of claim 10, wherein the plurality of second channels are disposed around the first channel.

12. The particle removal device of claim 11, wherein the first channel has a circular cross section, and each of the plurality of second channels has a circular cross section.

13. The particle removal device of claim 8, wherein the first one or more channels include a plurality of channels, and the second one or more channels include one channel.

14. The particle removal device of claim 13, wherein the plurality of first channels are disposed around the second channel.

15. A particle removal device, comprising:
    a handheld module, comprising:
        a body comprising a nozzle, wherein a first one or more channels and a second one or more channels are formed in the body;
        a first tubing attached to the handheld module, wherein a first end of the first tubing is connected to the first one or more channels;
        an antistatic suction module connected to a second end of the first tubing opposite the first end, wherein the antistatic suction module comprises:
            an ion generator, wherein the second end of the first tubing is connected to the ion generator;
            a fluid generator connected to the ion generator; and
            a suction module;
        a second tubing attached to the handheld module, wherein a first end of the second tubing is connected to the second one or more channels, and a second end of the second tubing opposite the first end is connected to the suction module; and
        a shell covering the first tubing and the second tubing.

16. The particle removal device of claim 15, wherein the antistatic suction module comprises one or more wheels.

17. The particle removal device of claim 16, wherein the one or more wheels are motorized.

18. The particle removal device of claim 15, wherein the first one or more channels include one channel, and the second one or more channels include a plurality of channels.

19. The particle removal device of claim 18, wherein the plurality of second channels are disposed around the first channel.

20. The particle removal device of claim 19, wherein the first channel has a circular cross section, and each of the plurality of second channels has a circular cross section.

\* \* \* \* \*